US009413088B2

(12) United States Patent
Brotto et al.

(10) Patent No.: US 9,413,088 B2
(45) Date of Patent: Aug. 9, 2016

(54) CONTROLLED POWER FADE FOR BATTERY POWERED DEVICES

(71) Applicant: Black & Decker Inc., Newark, DE (US)

(72) Inventors: Daniele C. Brotto, Baltimore, MD (US); Michael K. Forster, White Hall, MD (US); Jason K. Leh, Rosedale, MD (US); Wing W. Lin, Bel Air, MD (US)

(73) Assignee: Black & Decker Inc., New Britain, CT (US)

( * ) Notice: Subject to any disclaimer, the term of this patent is extended or adjusted under 35 U.S.C. 154(b) by 0 days.

(21) Appl. No.: 14/603,977

(22) Filed: Jan. 23, 2015

(65) Prior Publication Data

US 2015/0137715 A1 May 21, 2015

Related U.S. Application Data

(63) Continuation of application No. 13/080,712, filed on Apr. 6, 2011, now Pat. No. 9,071,069.

(60) Provisional application No. 61/321,699, filed on Apr. 7, 2010.

(51) Int. Cl.

*H02P 1/00* (2006.01)
*H01R 12/70* (2011.01)

(Continued)

(52) U.S. Cl.

CPC ............ *H01R 12/7005* (2013.01); *B25F 5/021* (2013.01); *G01R 31/3627* (2013.01); *H01M 10/441* (2013.01); *H01M 10/482* (2013.01); *H01R 13/112* (2013.01); *H02J 7/0003* (2013.01); *H02J 7/007* (2013.01); *H02J 7/0008* (2013.01); *H02J 7/0019* (2013.01); *H02J 7/0021* (2013.01); *H02J 7/0031* (2013.01); *H02J 7/0047* (2013.01); *H02J 7/0063* (2013.01); *H02J 7/045* (2013.01); *H02P 3/08* (2013.01); *H02P 7/285* (2013.01); *H02P 7/29* (2013.01); *H05B 33/0806* (2013.01); *G01R 31/362* (2013.01); *G01R 31/3682* (2013.01); *H01H 9/061* (2013.01); H01M 2010/4271 (2013.01); *H01M 2010/4278* (2013.01); *H01M 2220/30* (2013.01); *H02J 2007/004* (2013.01); *H02J 2007/0067* (2013.01); *H02P 31/00* (2013.01)

(58) Field of Classification Search

CPC ... H02P 2007/0088; H02P 3/08; H02P 7/285; H02P 7/29; H02P 6/085

USPC ......... 318/139, 430, 443, 454, 455, 478, 479, 318/490, 599; 320/116, 118, 132, 134, 145; 324/429, 431, 433

See application file for complete search history.

(56) References Cited

U.S. PATENT DOCUMENTS 4,211,478 A 7/1980 Huber et al.
4,254,396 A 3/1981 Saudax (Continued)

FOREIGN PATENT DOCUMENTS

EP 1898508 A2 3/2008
EP 2003760 A2 12/2008

(Continued)

*Primary Examiner* — Bentsu Ro
*Assistant Examiner* — Thai Dinh
(74) *Attorney, Agent, or Firm* — Amir Rohani

(57) ABSTRACT

A method is provided for operating a power tool having a motor powered by a battery. The method includes: delivering power from the battery to the motor in accordance with an operator input; detecting a condition of the power tool indicating a shutdown of the power is imminent; and fading the power delivered from the battery to the motor, in response to the detected condition, through the use of a controller residing in the power tool.

23 Claims, 13 Drawing Sheets

(51) Int. Cl.

| | |
|---|---|
| ***B25F 5/02*** | (2006.01) |
| ***H01M 10/44*** | (2006.01) |
| ***H02J 7/00*** | (2006.01) |
| ***H02J 7/04*** | (2006.01) |
| ***H02P 7/29*** | (2016.01) |
| ***H01M 10/48*** | (2006.01) |
| ***H05B 33/08*** | (2006.01) |
| ***H02P 3/08*** | (2006.01) |
| ***H02P 7/285*** | (2016.01) |
| ***H01R 13/11*** | (2006.01) |
| *H01H 9/06* | (2006.01) |
| *H01M 10/42* | (2006.01) |
| *G01R 31/36* | (2006.01) |
| *H02P 31/00* | (2006.01) |

(56) References Cited

U.S. PATENT DOCUMENTS 5,028,858 A 7/1991 Schnizler et al.
5,036,284 A * 7/1991 Cichanski ........ G01R 19/16542 320/132
5,193,067 A 3/1993 Sato et al.
5,537,656 A 7/1996 Mozdzen
5,589,755 A 12/1996 Kaite
5,595,446 A 1/1997 Schumaker
5,610,451 A 3/1997 Symonds
5,623,193 A 4/1997 Lang et al.
5,675,297 A 10/1997 Gose
5,729,116 A 3/1998 Tsenter
5,853,908 A 12/1998 Okutoh
5,892,665 A 4/1999 Matsumoto
5,945,803 A 8/1999 Brotto et al.
6,060,792 A 5/2000 Pelly
6,091,230 A 7/2000 Winzer
6,137,261 A 10/2000 Kurle et al.
6,150,823 A 11/2000 Takahashi et al.
6,177,209 B1 1/2001 Okutoh
6,232,747 B1 5/2001 Wright
6,268,710 B1 7/2001 Koga
6,296,065 B1 10/2001 Carrier
6,388,426 B1 5/2002 Yokoo et al.
6,392,373 B1 * 5/2002 Glasgow ...................... 200/1 R
6,392,415 B2 5/2002 Laig-Horstebrock et al.
6,424,799 B1 7/2002 Gilmore
6,445,162 B1 9/2002 Mukainakano
6,460,626 B2 10/2002 Carrier
6,661,203 B2 12/2003 Wolin et al.
6,675,912 B2 1/2004 Carrier
6,750,622 B2 * 6/2004 Simizu ................ A01D 34/006 318/139
6,822,423 B2 11/2004 Yaue et al.
6,836,614 B2 12/2004 Gilmore
6,943,510 B2 * 9/2005 Gorti ...................... H02P 6/085 318/268
6,950,030 B2 9/2005 Kovarik
7,065,435 B2 6/2006 Gorman
7,112,934 B2 9/2006 Gilmore
7,133,601 B2 11/2006 Philips et al.
7,157,882 B2 1/2007 Johnson et al.
7,164,257 B2 1/2007 Johnson et al.
7,235,949 B2 6/2007 Ikeda
7,270,910 B2 9/2007 Yahnker et al.
7,276,878 B2 10/2007 Phillips et al.
7,375,497 B2 5/2008 Melichar
7,453,238 B2 11/2008 Melichar
7,471,067 B2 12/2008 Tamezane
7,486,049 B2 2/2009 Wan
7,501,794 B2 3/2009 Felder et al.
7,504,804 B2 3/2009 Johnson et al.
7,508,171 B2 3/2009 Carrier et al.
7,541,781 B2 6/2009 Gamboa
7,551,441 B2 6/2009 Cohen
7,554,295 B2 6/2009 Melichar
7,589,500 B2 9/2009 Johnson et al.
7,602,146 B2 10/2009 Carrier et al.
7,612,525 B2 11/2009 Ito et al.
7,612,538 B2 11/2009 Kim
7,667,437 B2 2/2010 Johnson et al.
7,692,410 B2 4/2010 Coleman et al.
7,710,119 B2 5/2010 Bertness
7,719,234 B2 5/2010 Carrier et al.
7,719,236 B2 5/2010 Hartular
7,723,952 B2 5/2010 Phillips et al.
7,728,534 B2 * 6/2010 Lucas ................. A01D 69/025 318/139
7,728,553 B2 6/2010 Carrier et al.
7,759,898 B2 * 7/2010 Brotto ...................... B25F 5/00 320/112
7,772,805 B2 8/2010 Yamamoto
7,786,698 B2 8/2010 Felder et al.
7,791,297 B2 9/2010 Mueller et al.
7,791,318 B2 9/2010 Johnson et al.
7,817,384 B2 10/2010 Woods et al.
7,868,591 B2 1/2011 Phillips
7,928,692 B2 4/2011 Carrier et al.
7,944,181 B2 5/2011 Johnson et al.
8,446,120 B2 * 5/2013 Forster ..................... B25F 5/00 318/503
8,604,709 B2 * 12/2013 Jalbout ................ H02M 3/157 315/291
9,000,882 B2 * 4/2015 Velderman ............... B25F 5/00 173/2
2001/0028238 A1 10/2001 Nakamura
2003/0235754 A1 12/2003 Maloizel
2005/0073282 A1 4/2005 Carrier et al.
2005/0077878 A1 4/2005 Carrier et al.
2005/0088147 A1 4/2005 Svensson et al.
2005/0231165 A1 10/2005 Melichar
2005/0248351 A1 11/2005 Graf
2006/0091861 A1 5/2006 Melichar
2006/0233004 A1 10/2006 Furukawa et al.
2006/0290306 A1 12/2006 Broghammer
2007/0069735 A1 3/2007 Graf
2007/0212596 A1 9/2007 Nebrigic
2008/0003491 A1 1/2008 Phillips
2008/0097912 A1 4/2008 Dicks et al.
2008/0097913 A1 4/2008 Dicks et al.
2008/0097914 A1 4/2008 Dicks et al.
2008/0097917 A1 4/2008 Dicks et al.
2008/0103555 A1 5/2008 Dicks et al.
2008/0215120 A1 9/2008 Dicks et al.
2008/0218376 A1 9/2008 Dicks et al.
2008/0224852 A1 9/2008 Dicks et al.
2008/0231211 A1 9/2008 Taylor
2008/0309289 A1 * 12/2008 White .................. H02J 7/0063 320/136
2009/0115628 A1 5/2009 Dicks et al.
2009/0261756 A1 10/2009 Deppe
2009/0295334 A1 12/2009 Segawa
2010/0023285 A1 1/2010 Nakanishi
2010/0213900 A1 8/2010 Carrier et al.
2011/0001626 A1 1/2011 Tsoi
2011/0062888 A1 3/2011 McKee
2011/0121653 A1 5/2011 Spiridon

FOREIGN PATENT DOCUMENTS

EP 2073302 A1 6/2009
JP 06059003 A 3/1994
JP 11289656 A2 10/1999
JP 201155783 A 6/2001
JP 2004350468 A2 12/2004
WO 9961929 A1 12/1999
WO 0076017 A1 12/2000
WO 2006065306 A2 6/2006

* cited by examiner

CONTROLLED POWER FADE FOR BATTERY POWERED DEVICES

CROSS-REFERENCE TO RELATED APPLICATIONS

This application claims the benefit of U.S. Utility Application No. 13/080,712 filed on Apr. 6, 2011, which claims the benefit of U.S. Provisional Application No. 61/321,699 filed on Apr. 7, 2010. The disclosure of the above application is incorporated herein by reference.

FIELD

The present disclosure relates to portable electronic devices powered by batteries and, more particularly, to methods for controlling power fade during operation of such devices.

BACKGROUND

Cordless products or devices which use rechargeable batteries are prevalent in the marketplace. Rechargeable batteries may be used in numerous devices ranging from computers to power tools. Since the devices use a plurality of battery cells, the battery cells are commonly packaged in a battery pack. The battery pack may in turn be used to power the devices when coupled thereto. Once depleted, the battery pack may be recharged by a battery charger Over the past few years, lithium-ion (Li-ion) batteries have begun replacing nickel-cadmium (NiCd), nickel-metal-hydride (NiMH), and lead-acid batteries in such portable electronic devices. As compared to NiCd and NiMH batteries, Li-ion batteries are lighter but have a larger capacity per unit volume. For this reason, the Li-ion batteries are suitable to devices that are preferably light and which are required to endure continuous use for a long time. Li-ion batteries, however, may deteriorate rapidly when subjected to overcharging, over-discharging, overheating, or other adverse conditions. Therefore, these types of devices employ protective measures to prevent such adverse conditions. Upon detecting an adverse condition, the system can be designed to abruptly terminate discharge of current from the batteries and thereby cease device operation.

Therefore, it is desirable to develop a protection scheme that prolongs operation of the device before current discharge is terminated and/or warn the operator that the device is approaching a condition which requires terminating current discharge. This section provides background information related to the present disclosure which is not necessarily prior art.

SUMMARY

A method is provided for operating a power tool having a motor powered by a battery. The method includes: delivering power from the battery to the motor in accordance with an operator input; detecting a condition of the power tool indicating a shutdown of the power is imminent; and fading the power delivered from the battery to the motor, in response to the detected condition, through the use of a controller residing in the power tool.

A power tool system is presented that fades the power delivered by a battery upon detecting a condition of the power tool indicating a shutdown of the power is imminent. The power tool includes: a tool assembly having a motor; a battery pack that selectively couples to the tool assembly and operates to provide power to the motor; and a discharge control module that monitors a parameter indicative of tool operation while power is delivered from the battery pack to the motor and fades the power delivered from the battery to the motor by an amount that is computed as a function of a value of the parameter.

In another aspect of this disclosure, a method is provided for operating a power tool powered by a battery having a plurality of battery cells. The method includes: measuring voltage of the battery while current is being drawn from the battery; interrupting current momentarily to measure voltage of the battery in an unloaded condition; measuring voltage of the battery in an unloaded condition; comparing the unloaded voltage measure to a voltage cutoff threshold; and resuming current draw from the battery when the unloaded voltage measure exceeds the voltage cutoff threshold. When the unloaded voltage measure is less than the voltage cutoff threshold, current discharge from the battery is terminated.

This section provides a general summary of the disclosure, and is not a comprehensive disclosure of its full scope or all of its features. Further areas of applicability will become apparent from the description provided herein. The description and specific examples in this summary are intended for purposes of illustration only and are not intended to limit the scope of the present disclosure.

DRAWINGS

Figure 1:
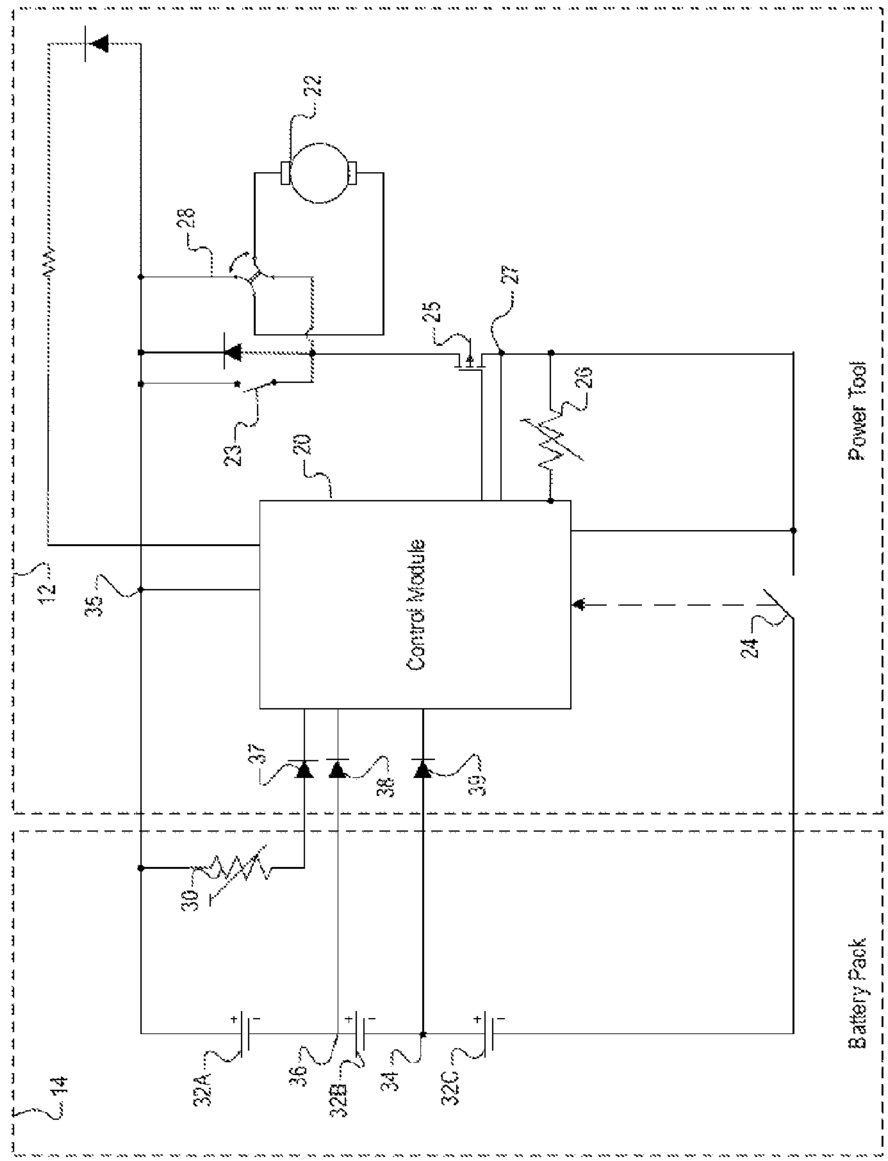
FIG. 1 is a schematic illustrating an exemplary embodiment of a power tool.

The drawings described herein are for illustrative purposes only of selected embodiments and not all possible implementations, and are not intended to limit the scope of the present disclosure. Further areas of applicability will become apparent from the description provided herein. The description and specific examples in this summary are intended for purposes of illustration only and are not intended to limit the scope of the present disclosure. Corresponding reference numerals indicate corresponding parts throughout the several views of the drawings.

DETAILED DESCRIPTION

FIG. 1 depicts an exemplary configuration of a power tool assembly comprised of a power tool 12 and a battery pack 14. The power tool assembly may be comprised of a tool instrument (not shown) which is driven by a motor 22. The motor 22 is controlled by a discharge control module 20. The discharge control module 20 monitors various conditions of the power tool and the battery pack and controls the power output to the motor accordingly. The exemplary configuration is merely provided as a context for describing the concepts presented below. It is understood that the configuration may represent only a portion of the internal circuitry and thus may include additional functionality or components such as protection circuits which are not shown herein for reasons for clarity.

In the exemplary embodiment, the battery pack 14 is removably coupled via cell tabs or terminals (not shown) to the power tool 12. The battery pack 14 includes three battery cells, 32A, 32B and 32C although more or less cells are contemplated. For purposes of describing the exemplary embodiments, the battery pack 14 employs cells having lithium-ion cell chemistry. It is understood that the battery pack 14 may be composed of cells of another lithium-based chemistry, such as lithium metal or lithium polymer, or another chemistry such as nickel cadmium (NiCd), nickel metal hydride ride (NiMH) and lead-acid, for example. Additionally, other means of coupling the pack 14 to the tool 12 are envisioned or the pack 14 may be integrated into the power tool 12.

The motor 22 is controlled by an operator via an on/off variable speed trigger switch 24, which when engaged by the user, closes a switch coupled to the variable speed trigger switch 24. The variable speed trigger switch 24 may be pressed in by the operator using various pressures and the rotational speed of the motor 22 corresponds to the total distance traveled by the variable speed trigger switch 24. For example, when the trigger switch 24 is pressed all the way in, absent a fade condition (discussed below), the rotational speed of the motor 22 will be at full capacity. As the amount of total distance traveled by the trigger switch 24 decreases, the rotational speed of the motor 22 will decrease as well. As will be discussed, this can be achieved by pulse width modulating the power signal to the motor 22.

In power tools where a reverse operation is preferred, e.g. a screwdriver or drill, the power tool 12 further includes a 2 point double-pole-double-throw (DPDT) switch 28, whereby the polarity of the circuit is reversed by throwing the DPDT switch 28. As may be appreciated, the power tool operator may manually push a button or switch on the exterior of the power tool to cause the motor 22 to operate in reverse. When the operator manually pushes the reverse button or switch, the DPDT switch 28 is thrown and the motor 22 will rotate in the opposite direction.

Furthermore, the power tool assembly may include an LED (Not shown). The LED may be lit when the power tool is in operation. The LED may be coupled to the discharge control module 20, so that the LED is provided with power when the variable trigger switch 24 is engaged by a user.

In the exemplary embodiment, the discharge control module 20 is located in the power tool 12. This configuration, although not required, decreases the cost of a battery pack as well as allows for different tools to use the same type of battery pack. The discharge control module 20 controls the power being delivered to the motor 22, which drives the power tool instrument (not shown). When the operator engages the trigger switch 24, discharge control module 20 sets the duty cycle of a control signal is set in accordance with position of the trigger switch 24. More specifically, the discharge control module 20 provides a pulse width modulated control signal to FET 25 which in turn closes the circuit so power is delivered to the motor 22. For explanatory purposes, the switch is hereinafter referred to as a trigger switch 24, but it is understood that the switch 24 may be other types of switches. When a cutoff condition exists, e.g. the battery temperature increases above a temperature cutoff threshold, the discharge control module 20 terminates the control signal to the FET 25, thereby opening the circuit and depriving the motor 22 of power. While the following description is provided with reference to a discharge control module residing in the tool, it is understood that broader aspects of this disclosure can be implemented by a control module residing in the battery pack.

When an operator disengages the trigger switch 24, the discharge control module 20 can shut off the motor 22 by, for example, closing a brake switch 23 thereby shorting the motor. In some embodiments, the brake switch 23 is mechanically coupled to the variable speed trigger switch 24 so that once the switch is opened, the brake switch is closed, which shorts the motor 22.

The discharge control module 20 also monitors various conditions of the power tool 12 and the battery pack 14 to determine if a condition requiring a tool shutdown is imminent. Upon detecting such condition, the discharge control module may initiate a fading of the power delivered from the battery to the motor which may be referred to herein as a power fade. A power fade is when the total power output to the motor is slowly decreased as the condition being monitored approaches a cutoff condition. When a power fade is initiated, the power being delivered to the motor 22 is gradually decreased, so as to either prolong the use of the power tool until the cutoff condition is reached or to avoid the cutoff condition altogether. Furthermore, as the tool operator observes the power slowly decreasing, the tool operator will be aware that a cutoff condition is approaching. In operation, the discharge control module 20 can execute a main control loop that calls various subroutines to monitor various conditions of the power tool and battery pack. For purposes of explanation, the condition where a tool shutdown is approaching but not yet reached, such that a power fade is initiated, is hereinafter referred to as a fade condition.

For example, the discharge control module 20 can monitor the voltage of the battery pack. As shown in FIG. 1, the voltage of the battery pack 14 can be measured by discharge control module 20 at, for example, node 35. The voltage is read by the discharge control module 20 so that the voltage of the battery cells can be monitored. If the voltage falls below a fade voltage threshold, e.g. 10.5V, the discharge control module 20 initiates a power fade, the details of which are described below. Once the battery pack reaches a cutoff voltage, e.g. 10V, the discharge control module 20 cuts power to the motor 22 by turning the FET 25 off. Further a split cell voltage may be monitored at nodes 34 or 36. Extending from nodes 34 and 36 are cell taps extending from each node. A cell tap is a wire or other connection that couples the nodes 34 and 36 to the discharge control module 20.

To monitor the battery pack 14 temperature, a temperature sensor 30 is used. One example of a temperature sensor is a thermistor, which is a cost effective yet dependable means of monitoring the temperature in a circuit. It is envisioned, however, that other types of temperature sensors may also be used, e.g. thermometer or thermocouple. The temperature sensor 30 provides a reading of the battery pack temperature to the discharge control module 20. As will be described below, when the temperature of the battery pack 14 reaches a fade temperature threshold, which is less than the cutoff temperature threshold, the discharge control module 20 initiates a power fade. A second temperature sensor 26 is used to measure the temperature of the power tool 12. Similar to the first temperature sensor, a thermistor, thermometer, or a thermocouple may be used to measure the temperature.

While the foregoing describes some embodiments of the power tool 12, as well as the battery pack 14 coupled thereto, it is envisioned that other configurations can be implemented in the design of the power tool 12 and battery pack 14. Further, it is appreciated that the aspects of the invention discussed below may be applied to a wide variety of platforms and are not solely limited to the configuration described above.

One means for delivering power to the motor is by performing pulse width modulation (PWM) on the power signal or control signal sent to the FET 25. Pulse width modulation is a means of delivering varying amounts of power to the motor. The duty cycle of the control signal dictates the average value of the voltage delivered to the motor. Thus, a duty cycle of 80% corresponds to an 80% voltage output, which is obtained by having the voltage ON for 80% of the cycle and OFF for 20% of the cycle. This can be achieved by having the FET 25 closed 80% of the time and open the remaining 20% of the time. Thus, by controlling the value of the PWM duty cycle various voltage outputs can be achieved.

As discussed above, the total distance traveled by the variable speed trigger switch 24 can affect the rotational speed of the motor 22. The rotational speed of the motor 22 is controlled by setting the PWM duty cycle equal to a value based on the desired rotational speed of the motor 22. For instance if the operator presses the trigger the maximum distance, the PWM duty cycle will initially be set to 100%. As the pressure applied to the trigger 24 decreases, thereby indicating that the operator wishes to slow the motor 22, the PWM duty cycle is decreased as well.

Moreover, if a fade condition is realized, the PWM duty cycle can be decreased to prolong the use of the motor before the cutoff condition is reached. As will be described below, the discharge control module 20 will monitor various components of the tool, and if any of the components are approaching a cutoff condition, i.e. are in a fade condition, the discharge control module 20 calculate a PWM duty cycle based on a value corresponding to the component in a fade condition state. It is appreciated that the PWM duty cycle that controls the motor 22 is set equal to whichever is less of the PWM duty cycle corresponding to the trigger switch 24 or the PWM duty cycle corresponding to the component in a fade condition state.

In most situations, a fade condition will not be realized. In these instances, the PWM duty cycle can be set to 100% or any other value corresponding to the distance traveled by the trigger switch 24. In other situations, a cutoff condition will be realized. In these instances, the PWM duty cycle should be set to 0%. In the situations where a fade condition has not yet reached a cutoff condition, the PWM duty cycle can be set between a maximum PWM duty cycle, e.g., 100%, and a minimum PWM duty cycle, e.g., 20% or 0%. Further, it is envisioned that as the value of a monitored parameter approaches a cutoff condition, the duty cycle may be slowly decreased, thereby resulting in a power fade of the power output. As mentioned above, if the user releases the trigger switch 24 the position of the trigger switch 24 may result in a PWM duty cycle which is less than a duty cycle corresponding to a fade condition.

Figure 2A:
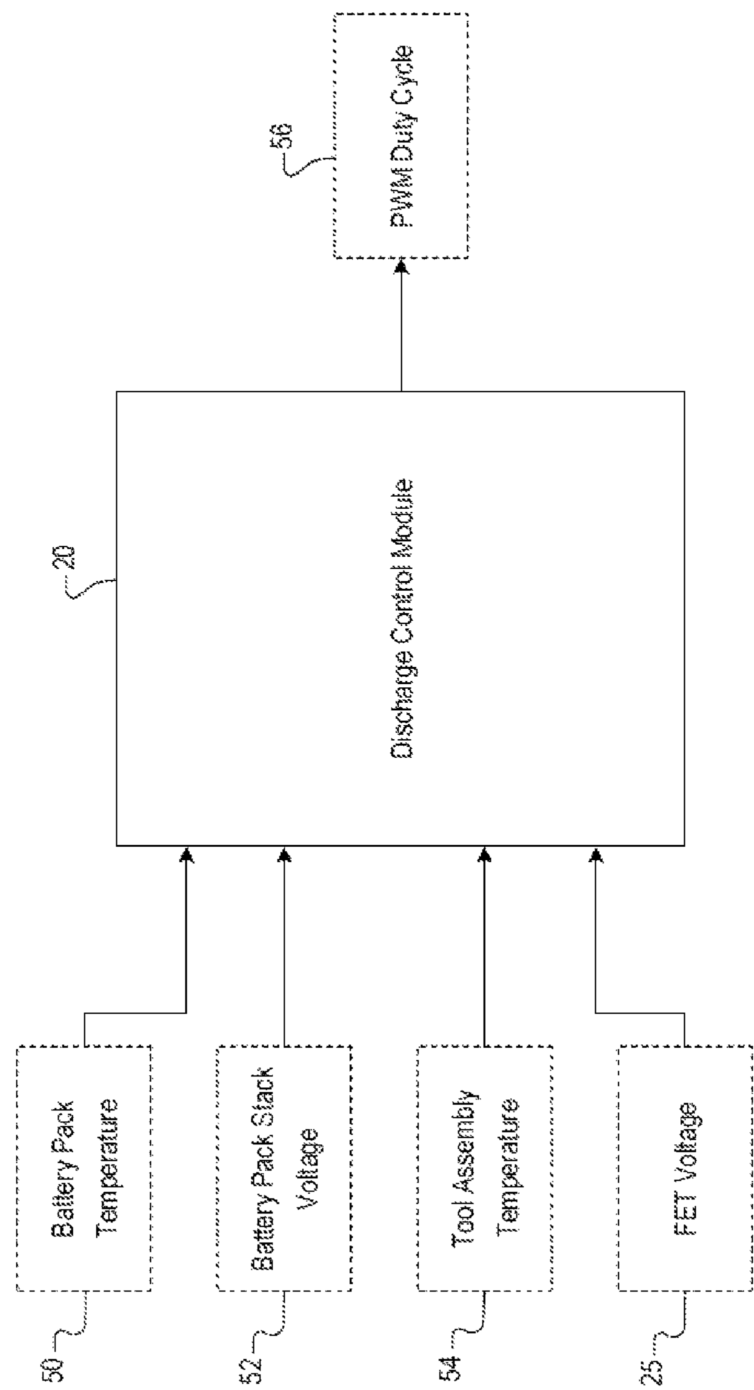
FIG. 2A is a block diagram illustrating inputs and outputs to a discharge control module.

FIG. 2A depicts exemplary inputs and outputs to the discharge control module 20. The discharge control module 20 receives signals representative of various measured parameters from various sensors or nodes. In this example, the discharge control module 20 receives a battery pack temperature signal 50 from a battery pack temperature sensor 30, a stack voltage signal 52 from a node associated with the battery pack, a tool assembly temperature signal 54 from a tool assembly temperature sensor and a FET drain voltage 56 from the FET. These measured parameters are exemplary and are in no way intended to be limiting. It is appreciated that other measured parameters may be monitored by the discharge control module 20, such as motor speed, motor torque, tool rotation etc.

The discharge control module 20, when the tool is turned on, may execute a control loop to monitor the various measured parameters and based on the measured parameters will determine a PWM duty cycle for the power signal 56. The discharge control module 20 determines whether any of the measured parameters are below any of the fade condition thresholds for the monitored conditions, e.g. whether the battery pack temperature is too high. If so a fade PWM duty cycle can be calculated based on the monitored sensor value. If two or more measured parameters necessitate a power fade, then the lowest calculated fade PWM duty cycle can be set to the actual PWM duty cycle.

Figure 2B:
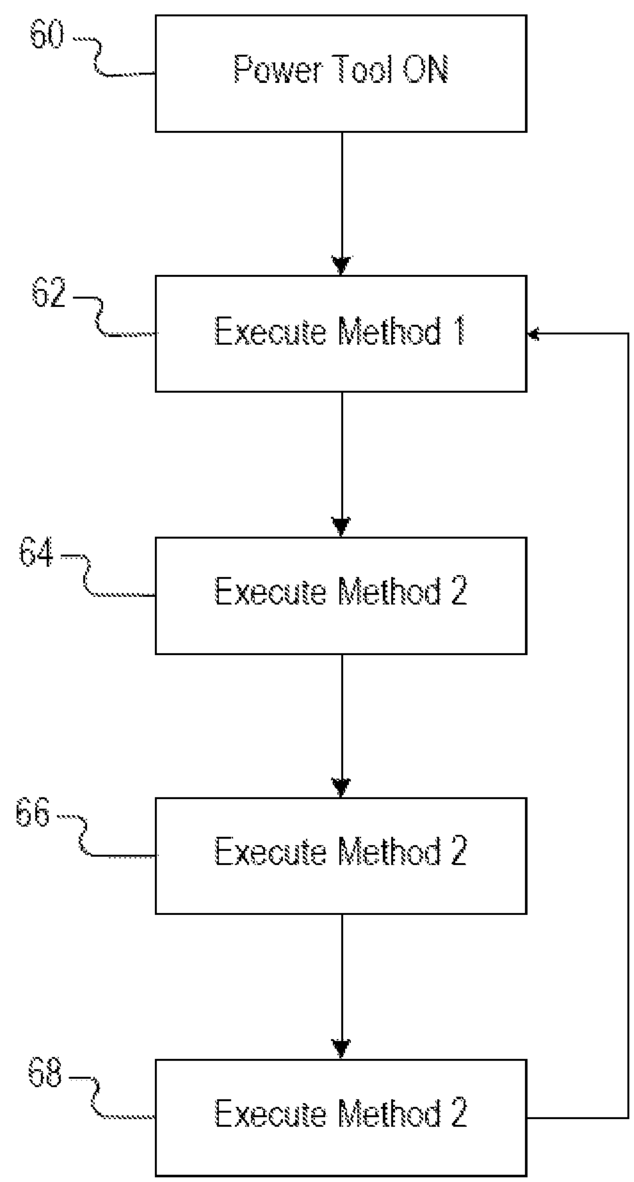
FIG. 2B is a flow diagram illustrating an exemplary embodiment of a control loop.

FIG. 2B demonstrates the main control loop which starts executing at step 60, when the power tool is turned on by the user. The control loop will continue to execute until the power tool is shut down or until the discharge control module 20 is operated in a low power consumption mode, as is described below. In the latter scenario, the discharge control module 20 may be returned to a full power consumption mode using a watchdog timer. At steps 62-68, various methods or applications are initiated by the control loop to monitor the various measured parameters and control the PWM duty cycle of the discharge control module 20 based on the measured parameters. The foregoing is provided for an example of a main control loop and the number of methods called by the control loop is purely provided for example only. Furthermore, while FIG. 2B depicts the methods executing in series, it is envisioned that the methods may also execute in parallel or concurrently.

Figure 3:
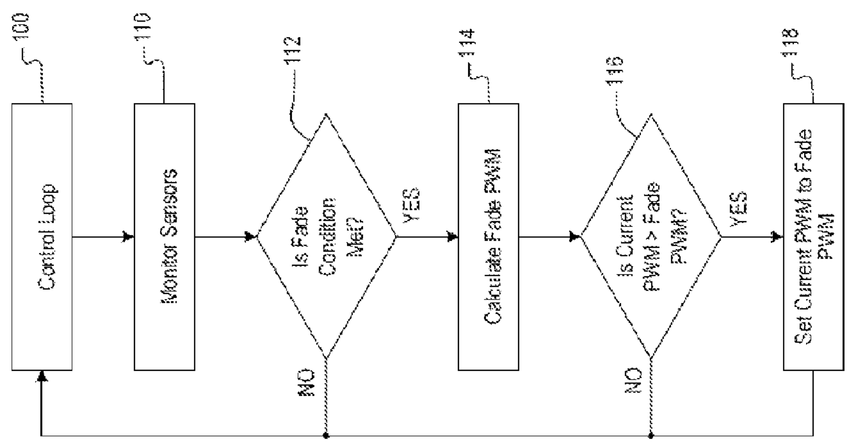
FIG. 3 is a flow diagram illustrating an exemplary embodiment of a method to determine a PWM duty cycle based on a measured parameter.

FIG. 3 depicts an example method that may be executed by the discharge control module 20. The discharge control module 20 receives signals representing values of various measured parameters and determines if a particular parameter value is below a corresponding fade threshold value. If the particular parameter value is below the corresponding fade threshold value, i.e. the power tool is in a fade condition, then a PWM duty cycle is calculated based on the measured parameter. The calculated PWM duty cycle is compared to the actual PWM duty cycle to determine if the actual PWM duty cycle needs to be set equal to the PWM duty cycle.

At step 100, the control loop will call the subroutine to determine if a power fade should be performed. The discharge control module 20 receives signals representing values of various measured parameters from any of the various sensors or nodes in the power tool or the battery pack at step 110. For example, the discharge control module 20 may receive signals from a temperature sensor monitoring one of the battery pack 14 temperatures, the FET 25 temperature, and a voltage reading from a node between two of the battery cells. It is envisioned that other conditions of the power tool or battery pack may be monitored as well.

At step 112, the measured parameter is compared with a fade threshold. For example, a temperature reading from the battery pack may be compared to a battery pack fade temperature threshold. In this example, if the temperature reading exceeds the battery pack fade temperature threshold, then the fade condition is met, and the method proceeds to step 114. If the fade condition is not met, the method steps back to the control loop.

Next, if the fade condition is met, the fade PWM duty cycle is calculated at step 114. Depending on the type of fade condition, the calculation may vary. Examples relating to calculated PWM duty cycles for particular fade conditions are provided below. One general example is to calculate a linear equation representing the PWM duty cycle as a function of the monitored condition. Knowing the maximum PWM duty cycle, e.g. 100%, the minimum PWM duty cycle, e.g. 20% or 0%, the fade conditions corresponding to maximum and minimum PWM duty cycles, and the measured parameter, the fade PWM duty cycle can be calculated as follows:

$$FadePWM = MaxPWM - \frac{MaxPWM - MinPWM}{FCEnd - FCStart}(MC - FCStart) \quad (1)$$

wherein FCStart is the start of the fade condition, i.e. at what value of the measured parameter is the power fade initiated, FCEnd is the end of the fade condition, and MC is the measured parameter value. It is envisioned that various models for calculating a fade PWM duty cycle may be incorporated. While this disclosure discusses calculating substantially linearly decaying PWM duty cycles, a step model, a polynomial model or an exponential decay model may also be implemented. Once the PWM duty cycle is calculated, the method proceeds to step 116.

The actual PWM duty cycle, i.e. the PWM duty cycle that the power tool is currently operating at, is compared to the calculated fade PWM duty cycle at step 116. If the actual PWM cycle is greater than the calculated fade PWM duty cycle, then the actual PWM duty cycle is set to the calculated PWM duty cycle at step 118. If the actual PWM cycle is not greater than the calculated fade PWM duty cycle, then the subroutine returns to the control loop.

The decision not to update the actual PWM duty cycle to the calculated fade PWM duty cycle when the fade PWM duty cycle is less than the PWM duty cycle determined by trigger position is based on the assumption that the PWM duty cycle may already be set below the calculated fade PWM duty cycle because another measured parameter may be closer to the cutoff condition than the sensor measured parameter analyzed in the steps described above. For example, if the battery cell is almost wholly depleted and the actual PWM duty cycle was set to reflect this condition, then a battery pack temperature that is barely past the fade condition threshold should not increase the duty cycle. In some embodiments, however, that actual PWM duty cycle could be set to the calculated fade PWM duty cycle, regardless of the comparison of the two values.

In some embodiments, the method may be implemented so that when the PWM duty cycle is calculated, the PWM duty cycle is calculated to 0% when a cutoff condition is met. However, in other embodiments, the measured parameters are compared with predetermined cutoff conditions to determine if a cutoff condition has been realized. If a cutoff condition is realized, then the method may set the PWM duty cycle to 0% and the method ends.

As can be appreciated this method may execute continuously while the power tool is in use. Alternatively, the method may execute in predetermined time intervals. Also, it is envisioned that other variations of the method may be performed. For example, at step 112, if no fade conditions exist, then the actual PWM duty cycle may be set to 100%. This variation may be beneficial if a fade condition was previously realized, thereby initiating a power fade, but the fade condition was resolved prior to recalculating the PWM duty cycle.

The method described generally above may be used to monitor various conditions of the power tool and to protect the tool or battery pack from damage. In previous tools, the practice was to allow the various conditions to worsen while the tool operated at a 100% power output until the cutoff condition occurred, whereupon the tool was shut down and left inoperable until the cutoff condition was remedied. Using the general framework described above, however, may result in an increased operation time of the power tool as well as a prolonged life of the tool and/or the battery pack.

In some embodiments, the battery pack temperature may be monitored to determine if the battery pack is in a fade condition. If the battery pack temperature has reached or has exceeded a fade condition threshold, a PWM duty cycle corresponding to the battery pack temperature is calculated.

Figure 4:
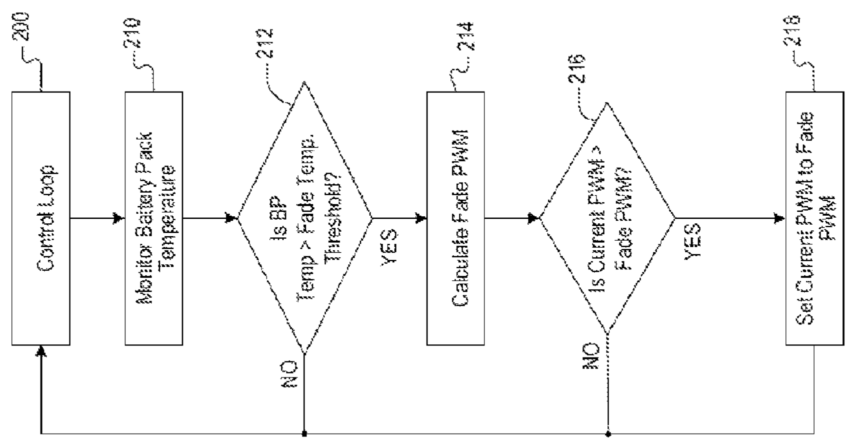
FIG. 4 is a flow diagram illustrating an exemplary embodiment of a method to determine a PWM duty cycle based on a battery pack temperature reading.

FIG. 4 illustrates a flow chart of a method that may be executed by the discharge control module 20 to monitor the battery pack temperature. At step 200, the control loop calls the subroutine to monitor the battery pack temperature. At step 210 the temperature of the battery pack is monitored. As previously mentioned, in some embodiments the temperature sensor may be a thermistor. In these embodiments, the discharge control module 20 measures a voltage at a pack thermistor input. The voltage measured at the pack thermistor input is a fraction of the battery pack voltage. From previously collected test data, the resistance of the thermistor at specific temperatures is known. Thus, by monitoring the voltage at the thermistor input and the voltage at the battery pack, a ratio of the battery pack voltage and the thermistor input voltage can be calculated. It is appreciated that the ratio corresponds to the resistance of the thermistor at a particular temperature. Thus, the calculated ratio may be used to query a look up table, whereby a temperature corresponding to the ratio is returned. It is appreciated that the look up table may be stored in non-volatile memory associated with the discharge control module 20.

At step 212 the method compares the determined battery pack temperature with the battery pack fade temperature threshold by comparing the voltage reading at the thermistor input of the discharge control module 20 with a voltage corresponding to the battery pack fade temperature threshold given the current voltage of the battery pack. It is understood that in some embodiments, the calculated ratio, i.e. the ratio of the pack voltage to the thermistor input voltage, may be compared to a predetermined ratio corresponding to the battery pack fade temperature. If the pack temperature is above the threshold, then the method proceeds to step 214. If not, the method steps back to step 210.

At step 214 the fade PWM duty cycle is calculated. As discussed, the PWM duty cycle may be calculated using equation 1. In particular, the fade PWM duty cycle may be calculated using the following:

$$FadePWM = MaxPWM - \frac{MaxPWM - MinPWM}{V_{TI\_End} - V_{TI\_Start}}(V_{TI\_Measured} - V_{TI\_Start}) \quad (2)$$

where $V_{TI\_Start}$ is the voltage reading corresponding to the beginning of a fade condition, $V_{TI\_END}$ is the voltage reading corresponding to the end of a fade condition, and $V_{TI\_Measured}$ is the actual measured voltage at the thermistor input. Furthermore, if should be appreciated that if the method is executing this step, then $V_{TI\_Start} \leq V_{TI\_Measured} \leq V_{TI\_END}$. Also, as previously mentioned, MaxPWM is the maximum PWM duty cycle, e.g. 100%, and MinPWM is the minimum PWM duty cycle, e.g. 20%. As discussed, the voltage at the thermistor input is dependent not only on temperature but also the remaining voltage of the battery cell. Thus, the values of $V_{TI\_Start}$ and $V_{TI\_END}$ will vary based on the battery cell voltage. The values may be retrieved from the previously collected data, which may be stored in the memory associated with discharge control module 20. It is appreciated that a look up table can be stored in the memory linking different battery pack voltage values to corresponding $V_{TI\_Start}$ and $V_{TI\_END}$ values. It is further appreciated, that actual measured temperatures of the battery pack can be used instead of the measured voltage values. It is appreciated, that measured temperatures of pack can be used instead of the measured voltage value. In this scenario, start temperature value and an end temperature value would be used in place of $V_{TI\_Start}$ and $V_{TI\_END}$.

Figure 5:
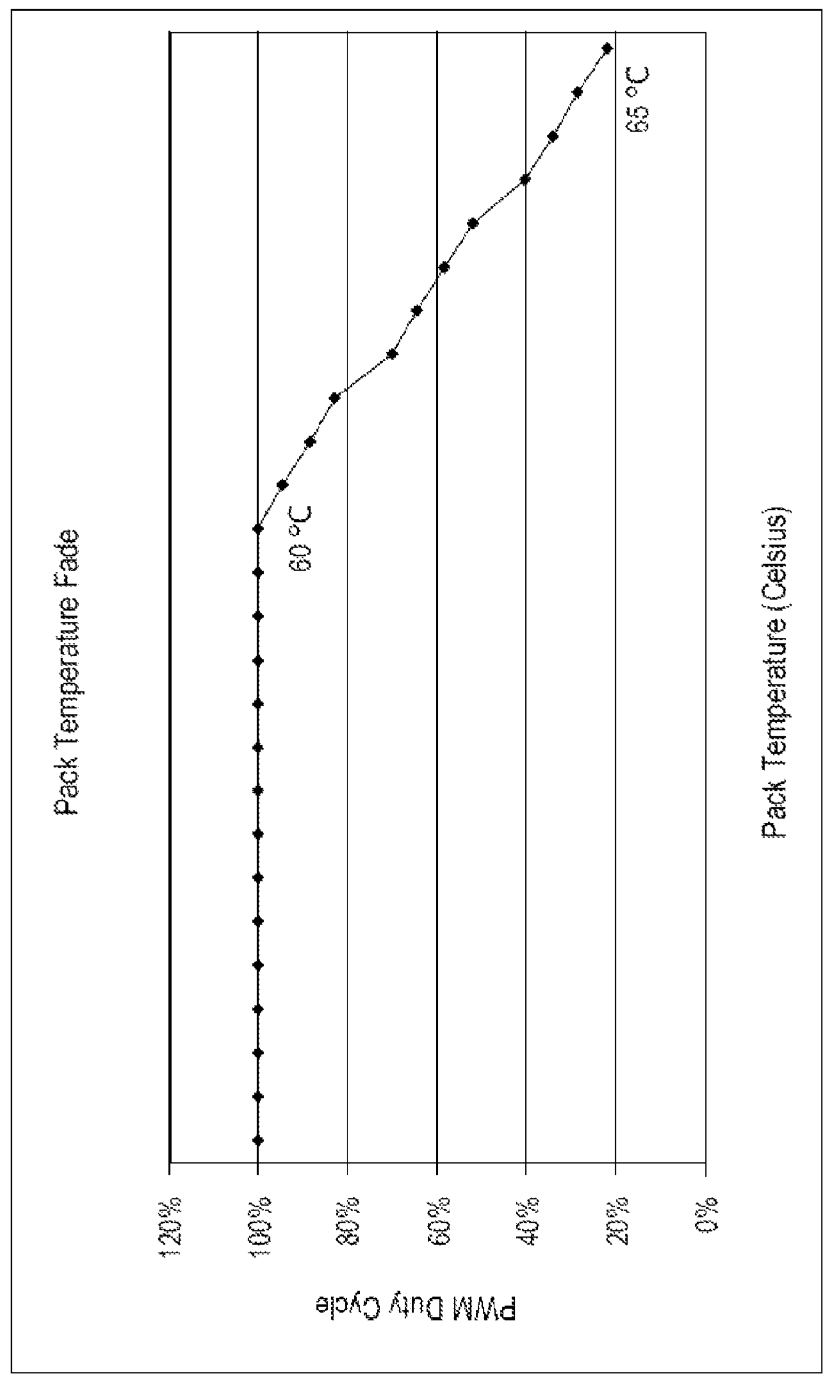
FIG. 5 is a graph illustrating the relationship between the PWM duty cycle and the temperature of the battery pack.

In an example embodiment, the fade condition may begin when the battery pack temperature is at 60° C. and end when the temperature is at 65° C. In this example, the maximum PWM duty cycle is 100% and the minimum PWM duty cycle is 20%. Thus, using equation (2), if the current temperature of the battery pack is approximately 62° C., then the fade PWM duty cycle should be at approximately 68%. FIG. 5 depicts a graph demonstrating an exemplary relationship between battery pack temperature and the fade PWM duty cycle.

Once the fade PWM duty cycle is calculated, at step 216, the fade PWM duty cycle is compared against the actual PWM duty cycle, i.e. the duty cycle at which the tool is currently operating at. If the fade PWM duty cycle is less than the actual PWM duty cycle, then the actual PWM duty cycle is set to the fade PWM duty cycle at step 218. This is done because the temperature of the battery pack is increasing and approaching the cutoff temperature. If the fade PWM duty cycle is greater than the actual PWM duty cycle, then the method steps back to 210 and the actual PWM duty cycle is left unchanged. This may occur when the temperature of the battery pack begins decreasing as a result of the fade. It is envisioned that in some embodiments, however, that a reverse fade may be implemented, whereby the actual PWM cycle is always replaced by the calculated fade PWM duty cycle, such that as the temperature decreases, the PWM duty cycle increases.

It is envisioned that this method may run continuously or at predetermined time intervals. Furthermore, in some embodiments, the discharge control module 20 may check whether the voltage reading at the thermistor input is below a cutoff condition. In these embodiments, if the voltage reading is below the cutoff threshold, then the power may be cutoff until the battery pack temperature decreases below the cutoff threshold. Further, it is appreciated that the thresholds provided in the example above are provided for example only and are not intended to be limiting. Additionally, the order of the steps is not mandatory and it is appreciated that the steps may be executed in different orders. Furthermore, it is envisioned that alternative steps may be taken and not every step is essential.

In another aspect of the disclosure the switch assembly temperature may be monitored. It is appreciated that when the power tool is used for prolonged periods the temperature of the FET 25, or other components in the power tool circuit may increase to a point which may be damaging to the those components. Thus, the temperature of the power tool may be monitored and the PWM duty cycle of the power signal may be faded once the temperature reaches a value necessitating a power fade.

Figure 6:
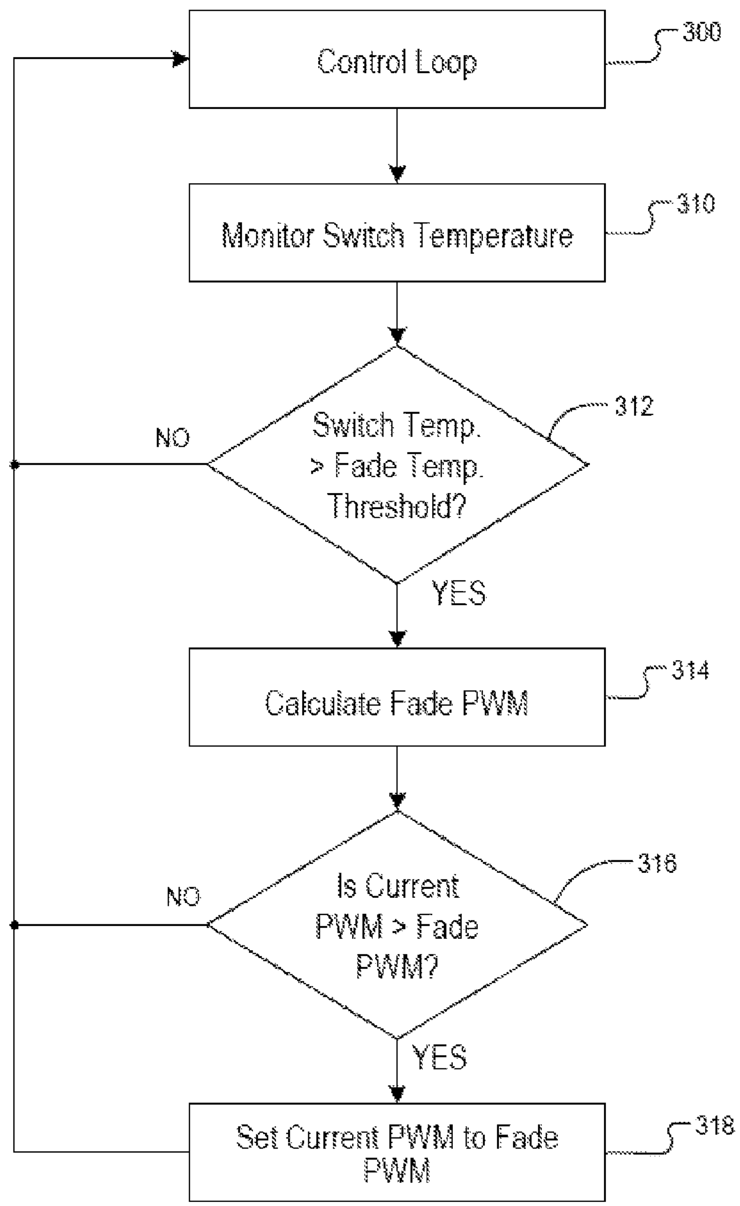
FIG. 6 is a flow diagram illustrating an exemplary embodiment of a method to determine a PWM duty cycle based on a FET temperature reading.

FIG. 6 illustrates a flow chart of a method that may be executed by the discharge control module 20 to monitor the switch assembly temperature. In some embodiments, the discharge control module 20 monitors the temperature of the FET 25 shown in FIG. 1. The temperature sensor may be a thermistor 26 disposed adjacent to the FET 25, whereby the discharge control module 20 measures a voltage at a second thermistor input. As opposed to the battery pack temperature sensor, the thermistor is connected to a constant voltage source. Thus, the voltages corresponding to the switch temperature fade threshold can be hard coded, as the voltage values corresponding to a start of a power fade and the end of a power fade will not vary as the voltage of the battery pack varies. With the exception of this caveat, the steps of FIG. 6 substantially correspond to the steps of FIG. 4.

At step 300 the control loop calls the temperature monitoring subroutine. At step 310, the voltage at the second thermistor 26 input is measured. At step 312, the measured voltage is compared to the voltage corresponding to the switch temperature fade threshold. If the voltage is less than the voltage corresponding to the switch temperature fade threshold, then a PWM duty cycle is calculated based on the switch temperature and the method steps to 314. If the voltage is greater than the voltage corresponding to the switch temperature fade threshold, then the switch temperature has not yet passed the fade threshold, and the method steps back to step 300.

At step 314 the fade PWM duty cycle is calculated. The fade PWM duty cycle is calculated based on a gain value and an offset value. The gain value can be calculated as follows:

$$\text{Gain} = \frac{MaxPWM - MinPWM}{V_{TFET\_Start} - V_{TFET\_End}} \quad (3)$$

The offset value can be calculated as follows:

$$\text{Offset} = \text{Gain} \times V_{TFET\_Start} - \text{Max}PWM \quad (4)$$

Using the gain and the offset, the fade PWM duty cycle can be calculated as follows:

$$\text{Fade}PWM = \text{Gain} \times V_{TFET\_Measured} - \text{Offset} \quad (5)$$

It is noted that the gain and the offset values can be based on fixed values so that in some embodiments, the gain and the offset values can be hard coded in the memory associated with the discharge control module 20. In these embodiments, the fade PWM duty cycle can be calculated based on the received voltage measurement. In other embodiments, the fade PWM can be calculated using the following formula:

$$FadePWM = MaxPWM + \frac{MaxPWM - MinPWM}{V_{TFET\_Start} - V_{TFET\_End}}(V_{TFET\_Measured} - V_{TFT\_Start}) \quad (6)$$

where $V_{TFET\_Start}$ is the voltage value corresponding to the beginning of a fade condition, $V_{TFET\_END}$ is the voltage value corresponding to the end of a fade condition, and $V_{TFET\_Measured}$ is the actual measured voltage at the second thermistor input. Also, as previously mentioned, MaxPWM is the maximum PWM duty cycle, e.g. 100%, and MinPWM is the minimum PWM duty cycle, e.g. 20%. As discussed, the voltage at the second thermistor input is dependent on temperature and not on the remaining voltage of the battery cell. Thus, the values of $V_{TFET\_Start}$ and $V_{TFET\_END}$ may be hard coded based on expected voltages at the threshold temperatures. It is appreciated, that measured temperatures of FET can be used instead of the measured voltage value. In this scenario, start temperature value and an end temperature value would be used in place of $V_{TFET\_Start}$ and $V_{TFET\_END}$.

Figure 7:
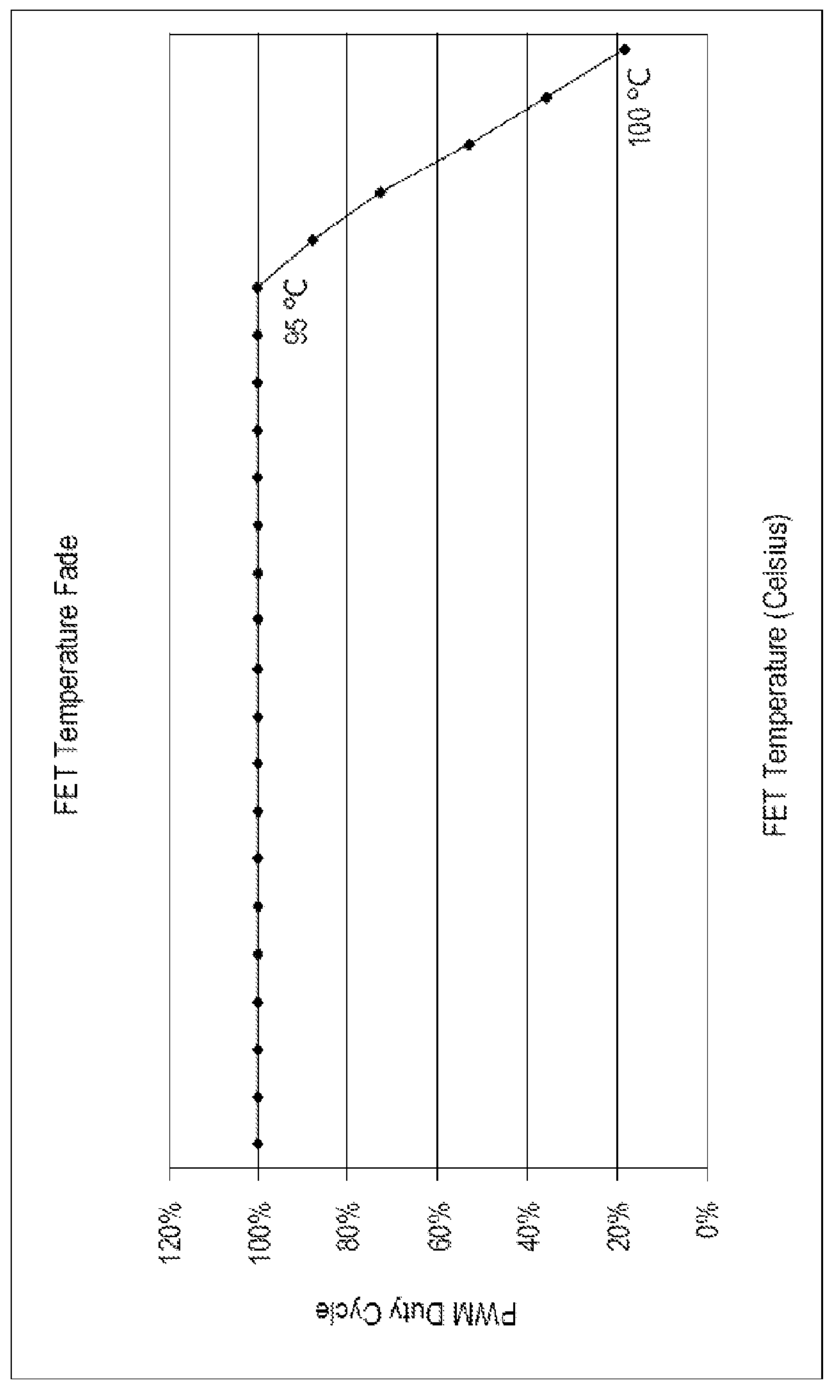
FIG. 7 is a graph illustrating the relationship between the PWM duty cycle and the temperature of the FET switch.

In an example embodiment, the fade condition may begin when the switch temperature is at 95° C. and end when the temperature is at 100° C. In this example, the maximum PWM duty cycle is 100% and the minimum PWM duty cycle is 20%. Thus, using equations (3)-(5) or (6), if the current temperature of the battery pack is approximately 99° C., then the fade PWM duty cycle should be at approximately 36%. FIG. 7 depicts a graph demonstrating the relationship between switch temperature and the fade PWM duty cycle.

Once the fade PWM duty cycle is calculated, it may be compared against the actual PWM duty cycle, i.e. the duty cycle at which the tool is currently operating at. If the fade PWM duty cycle is less than the actual PWM duty cycle, then the actual PWM duty cycle is set to the fade PWM duty cycle. This is done because the temperature of the switch is increasing and approaching the cutoff temperature. If the fade PWM duty cycle is greater than the actual PWM duty cycle, then the method steps back to 300 and the actual PWM duty cycle is left unchanged.

In some embodiments, the discharge control module 20 determines whether the voltage reading is below a cutoff condition. In these embodiments, if the voltage reading is below the cutoff threshold, then the power is cut until the switch temperature decreases below the cutoff threshold. It is envisioned that this method may run continuously or at predetermined time intervals as determined by the control loop of the discharge control module 20. Further, it is appreciated that the thresholds provided in the example above are provided for example only and are not intended to be limiting. Furthermore, the order of the steps is not mandatory and it is appreciated that the steps may be executed in different orders. Furthermore, it is envisioned that alternative steps may be taken and not every step is essential.

In some of the embodiments using a thermistor as the temperature sensor 30, the thermistor is located on the positive (+) side of the trigger switch. In the prior art, battery pack thermistors are located on the negative (−) side of the trigger switch 24. With the configuration shown in FIG. 1, however, placing the thermistor on the (−) side of the trigger switch 24 results in a current leakage. As can be observed in FIG. 1, the trigger switch 24 is located on the (−) side of the power tool circuit. As a result, if the thermistor is placed on the (−) of trigger switch 24, the current would flow from the battery pack, through the discharge control module 20 and through the thermistor, thereby bypassing the variable speed trigger switch 24. By locating the thermistor on the (+) side of the trigger switch 24, the current leakage can be avoided because the trigger switch 24 would need to be engaged for current to flow.

To further prevent leakage, blocking diodes are used in some embodiments. Blocking diode 37 is placed between the thermistor 30 and the discharge control module as shown in FIG. 1. Blocking diodes 38 and 39 are also placed on the cell taps between nodes 36 and 34 respectively and the discharge control module 30. Diodes are devices that help control current flows within the circuitry, which help maintain isolation of power supplies within the circuitry. The blocking diodes, in the current configuration, help ensure that the current does not flow back to the cells from the discharge control module 20.

In another aspect of the disclosure, the discharge control module 20 may monitor the voltage of the battery pack. As the battery pack is discharged, the discharge control module 20 may initiate a power fade when the pack voltage reaches a predetermined voltage reading.

Figure 8:
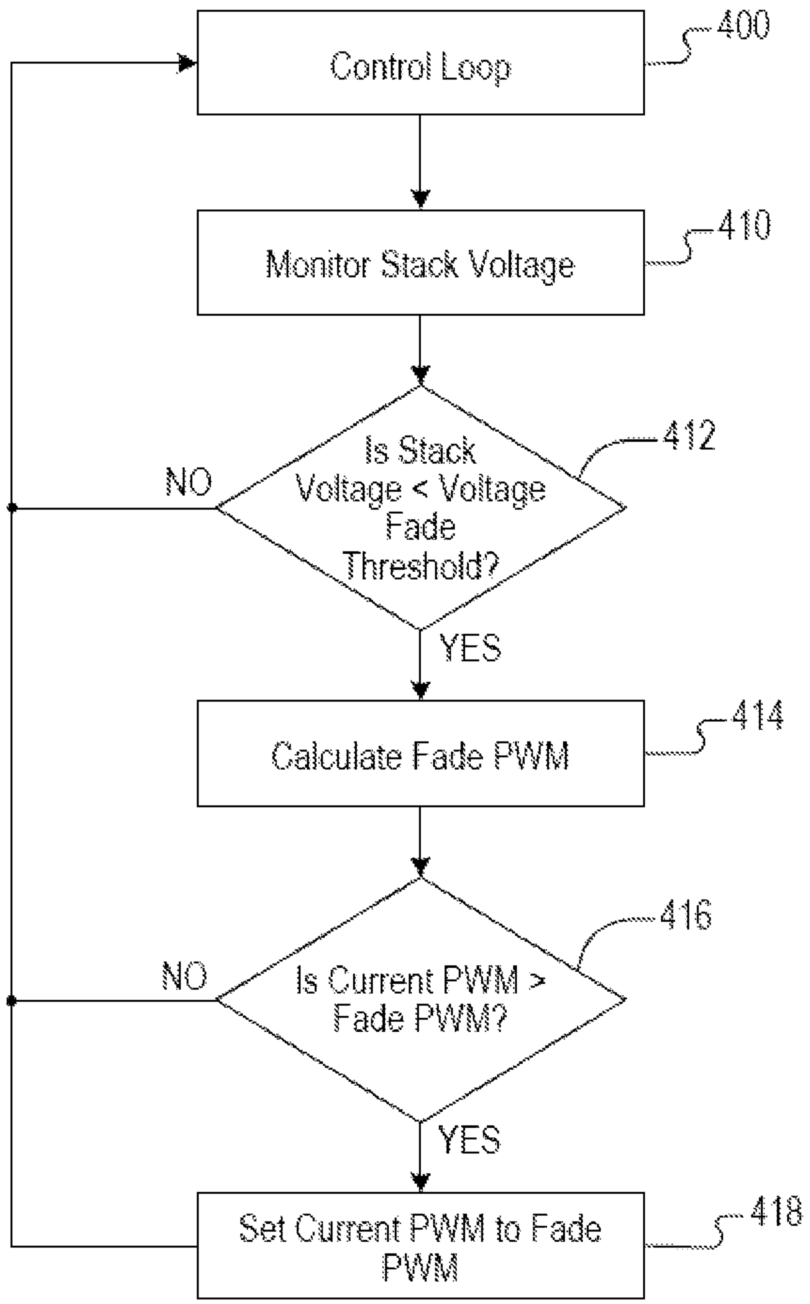
FIG. 8 is a flow diagram illustrating an exemplary embodiment of a method to determine a PWM duty cycle based on a battery pack voltage temperature reading.

FIG. 8 illustrates a flow chart of a method that is executed by the discharge control module 20 to monitor the battery pack voltage. At step 400, the control loop calls the voltage monitoring subroutine. As shown in FIG. 1, the voltage of the battery pack is read from node 35, sometimes referred to as a tap. Thus at step 410, the voltage is read from node 35 to monitor the voltage of the battery pack. It is further appreciated that the voltage of the individual cells or combinations of cells can also be determined. For example, the split stack voltage at node 34 can be read to determine the voltage of battery cell 32C. Using the voltages from node 35 and 34 the voltages of battery cells 32A and 32B can also be determined.

The voltage reading of the battery pack is compared to a voltage fade threshold as step 412. If the voltage reading is below the voltage fade threshold, then the method proceeds to step 414 where a PWM duty cycle is calculated based on the battery pack voltage. If the voltage reading is above the voltage fade threshold, then the battery still has enough capacity, and a power fade is not required. The voltage fade threshold may correspond to a battery capacity of 5% of the maximum charge remaining, for example.

At step 414 the fade PWM duty cycle is calculated. The fade PWM duty cycle may be calculated based on a gain value and an offset value. The gain value can be calculated as follows:

$$\text{Gain} = \frac{MaxPWM - MinPWM}{V_{BC\_Start} - V_{BC\_End}} \quad (7)$$

The offset value can be calculated as follows:

$$\text{Offset}=\text{Gain}\times V_{BC\_Start}-\text{Max}PWM \quad (8)$$

Using the gain and the offset, the fade PWM duty cycle can be calculated as follows:

$$\text{Fade}PWM=\text{Gain}\times V_{BC\_Measured}-\text{Offset} \quad (9)$$

It is noted that the gain and the offset values can be based on fixed values so that in some embodiments, the gain and the offset values can be hard coded in the memory associated with the discharge control module 20. In these embodiments, the fade PWM duty cycle can be calculated based on the received voltage measurement. In other embodiments, the fade PWM can be calculated using the following formula:

$$FadePWM = MaxPWM + \frac{MaxPWM - MinPWM}{V_{BC\_Start} - V_{BC\_End}}(V_{BC\_Measured} - V_{BC\_Start}) \quad (10)$$

In the foregoing equations, $V_{BC\_Start}$ is the voltage value of the battery pack corresponding to the beginning of a fade condition, $V_{BC\_END}$ is the voltage value of the battery pack corresponding to the end of a fade condition, and $V_{BC\_Measured}$ is the actual measured voltage at node 34. Also, as previously mentioned, MaxPWM is the maximum PWM duty cycle, e.g. 100%, and MinPWM is the minimum PWM duty cycle, e.g. 20%.

In an example embodiment, the fade condition begins when the battery cell reaches 10.5V and ends when the battery cell is at 10V. In this example, the maximum PWM duty cycle is 100% and the minimum PWM duty cycle is 20%. Thus, using equations (7)-(9) or (10), if the current voltage of the battery pack is approximately 10.2V, then the fade PWM duty cycle should be at approximately 52%. Once the fade PWM duty cycle is calculated, the duty cycle is compared against the actual PWM duty cycle, i.e. the duty cycle that the tool is currently operating at. If the fade PWM duty cycle is less than the actual PWM duty cycle, then the actual PWM duty cycle is set to the fade PWM duty cycle. The method then steps back to 410.

Figure 9:
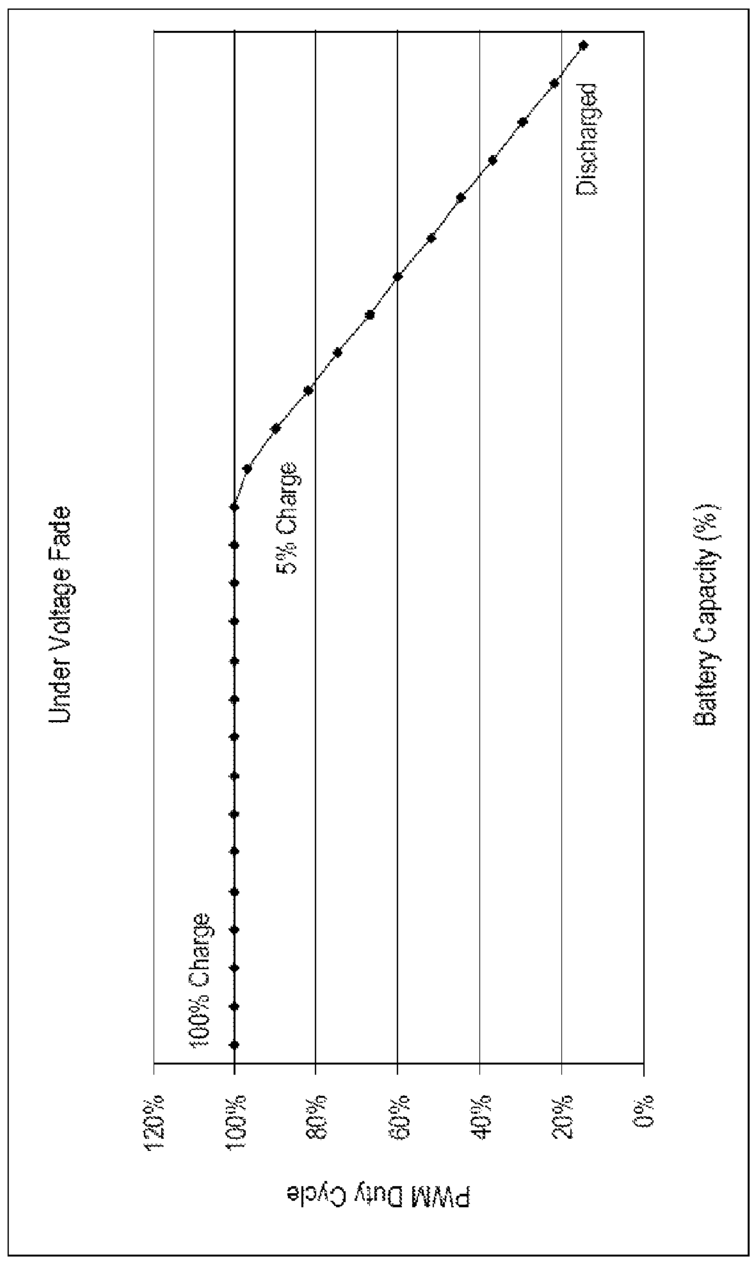
FIG. 9 is a graph illustrating the relationship between the PWM duty cycle and the capacity of the battery pack.

FIG. 9 depicts a graph demonstrating the relationship between battery pack capacity and the fade PWM duty cycle, where the pack voltage correlates directly with the battery pack capacity. It is envisioned that this method may run continuously or at predetermined time intervals as determined by the control loop of the discharge control module. Further, it is appreciated that the thresholds provided in the example above are provided for example only and are not intended to be limiting. Furthermore, the order of the steps is not mandatory and it is appreciated that the steps may be executed in different orders. Furthermore, it is envisioned that alternative steps may be taken and not every step is essential. Additionally, the method may be applied to monitor the voltages of the individual battery cells as well.

Although we have been discussing voltage fade as a method for indicating that a pre-determined cut-off condition is approaching via pack temperature, pack voltage, module temperature, tool rotation, motor torque etc., it is envisioned that other methods of indication to the tool user can be implemented as well such as an LED indication (i.e., flashing the LED at varying rates based on monitors proximity to the cut-off limit). Additionally or alternatively, the motor can be made to ‘pulse’ by varying the PWM on and off at specific times. These are just a few ideas of other ways to indicate to the user that a condition is occurring.

In another aspect of the disclosure, the discharge control module 20 is configured to prevent erroneous readings at startup in cold conditions. As mentioned, when the battery pack reaches an under voltage condition, the discharge control module 20 may determine that a cutoff condition has been reached. In these instances, the power to motor 22 will be cut, thereby preventing the battery pack from entering into a deep discharge state. One problem associated with rechargeable battery packs, however, is that an increased voltage drop under a load condition may be observed in cold temperatures, e.g. below 10° C. In these cold conditions, when the tool operator first turns the power on, a high in rush current will cause a relatively large voltage drop. Additionally, cold conditions may cause the impedance in the battery pack circuit to increase, further exacerbating the voltage drop.

To combat this problem, the discharge control module 20 is configured to disregard the voltage readings for a predetermined time period, e.g. 300 ms, hereinafter referred to as a blanking time period. The blanking time period is a period where the discharge control module 20 allows the motor to run without monitoring the measured parameters to determine whether a shutdown condition is reached. During the blanking time period, the discharge control module 20 will bias the FET 25, thereby allowing current to flow to the motor 22, without determining if a under voltage condition exists. Once the blanking time period has passed, the discharge control module 20 will resume the monitoring of the various input signals to determine if an under voltage condition exists, and may cutoff the motor if such a condition does exist.

One drawback with having a predetermined blanking time period, however, is that depending on the temperature the blanking time period may be too short or may be too long. If the blanking time period is too short, the blanking time period may lapse while the voltage reading remains adversely affected by the cold condition. Consequently, the tool may be shutdown prematurely despite the battery pack actually having enough voltage to power the motor 22. On the other hand, if the blanking time period is too long and the battery pack 14 is actually depleted, then the battery pack 14 may be allowed to discharge even though the remaining charge in the battery pack would necessitate a shutdown of the tool.

As a means of remedying the above-described situations, some embodiments implement a variable blanking time period that is dependent on factors that influence the readings of the voltage, such as temperature. For example, if the battery pack temperature is relatively low, then the blanking time period should be longer in duration than when the battery pack temperature is relatively high. Accordingly, the time period of the blanking time period can be dependent on the temperature of the battery pack.

Figure 10:
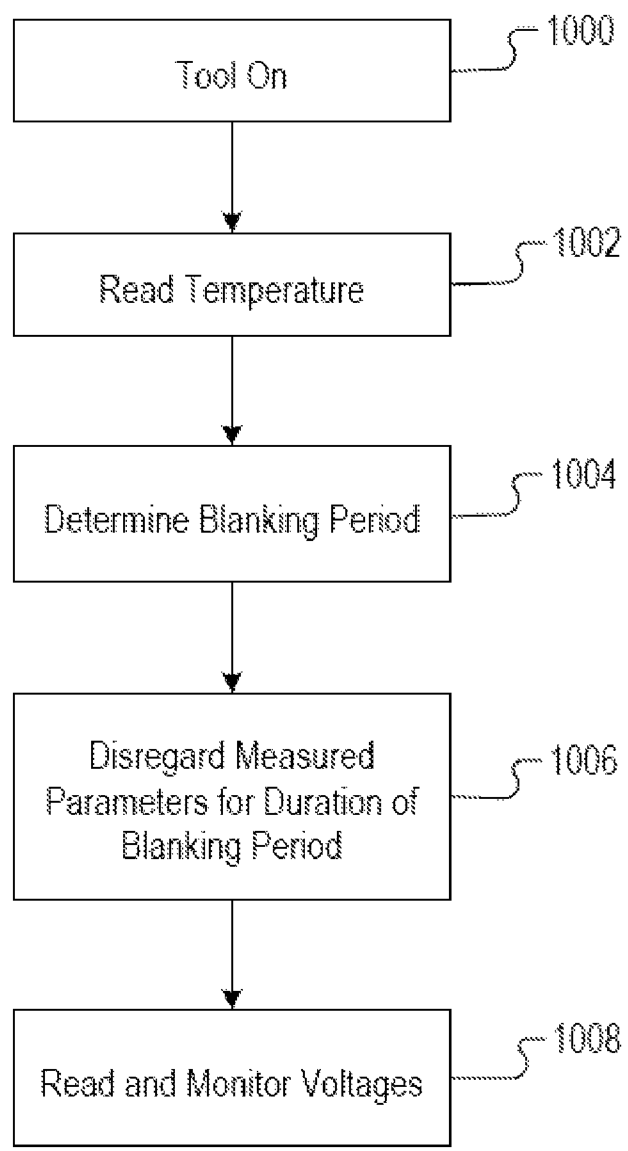
FIG. 10 is a flow diagram illustrating an exemplary method for monitoring a battery pack at tool startup.

FIG. 10 illustrates an exemplary method for monitoring a battery pack upon startup. At step 1000 the power tool is turned on by the operator. At step 1002, the battery pack temperature is read from the temperature sensor 30.

Figure 11:
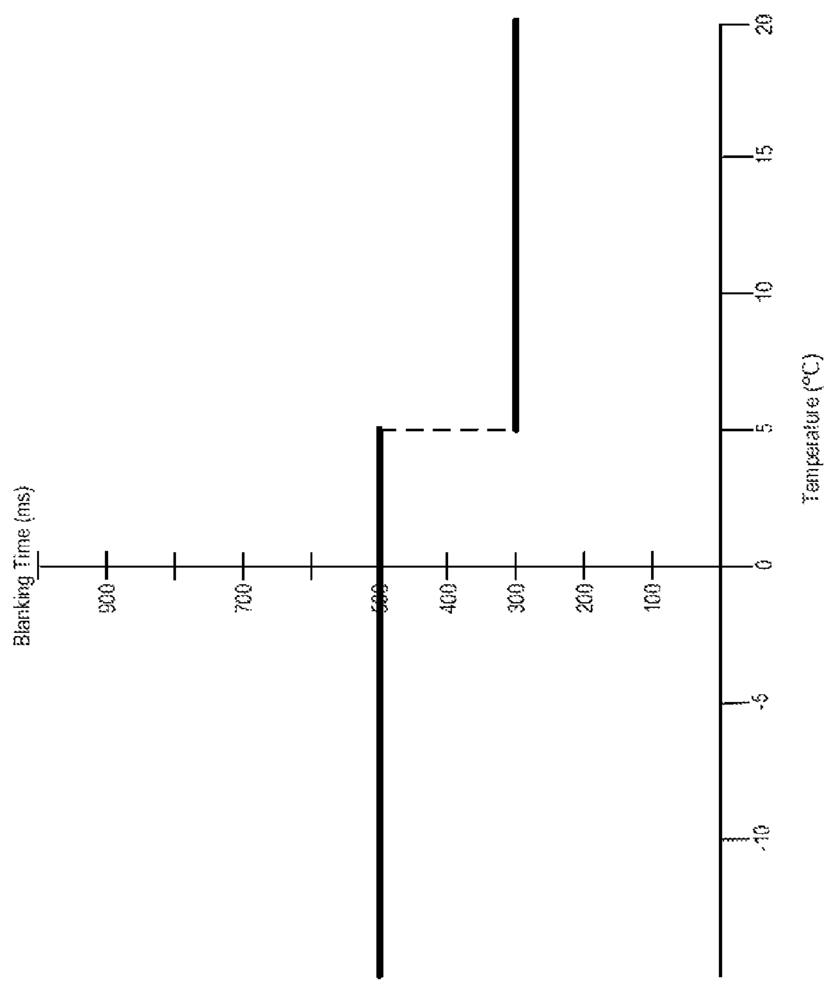
FIG. 11 is a graph illustrating an exemplary relationship between temperature and blanking time.

Once a battery pack temperature is determined, the discharge control module 20 determines a blanking time period based on the temperature at step 1004. The blanking time period can be determined a number of ways. For example, there may be a look up table stored in a memory associated with the discharge control module 20. In the look up table, various temperatures may have corresponding blanking time periods or temperature thresholds for setting the blanking time period. For example, FIG. 11 shows a graph of blanking time period as a function of temperature. As can be seen, once the temperature is less than 5° C., the blanking time period is increased from 300 ms to 500 ms. In alternative embodiments, an equation can be used to determine the blanking period. It is envisioned that a linear equation, a second or higher order equation, a logarithmic equation, exponential equation, or other type of equation may be used to set the blanking time period.

Once the blanking time period is determined, the power tool operates without the discharge control module 20 monitoring the measured parameters, including conditions of the battery pack, until the blanking time period has passed. Once the blanking time period is finished, the discharge control module 20 commences monitoring the measured parameters, including the voltage of the battery pack at step 1008. It is appreciated that the exact function to determine the blanking time period may also depend on the battery cell chemistry and the manufacturer of the battery cells.

Figure 12:
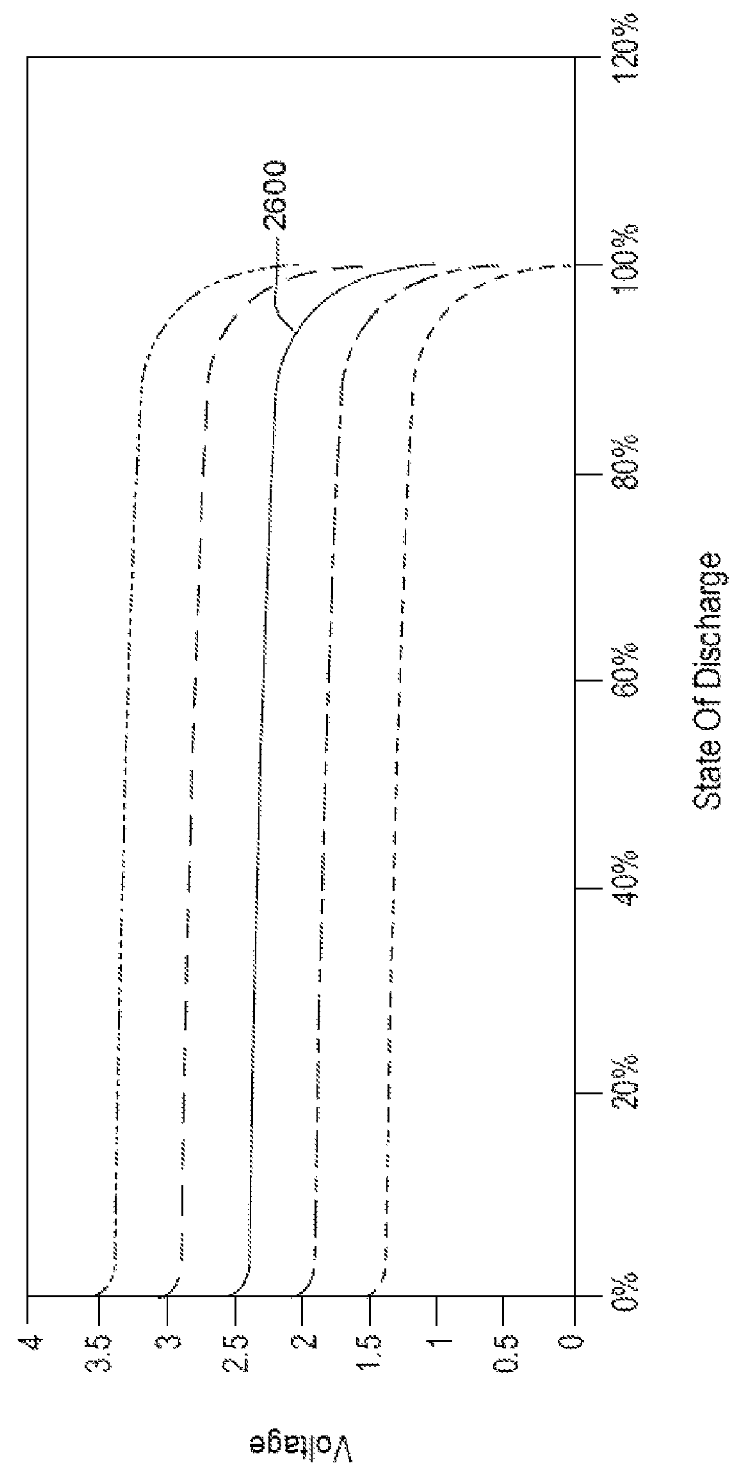
FIG. 12 is a graph depicting typical discharge curves for a lithium ion cell being discharged at different current loads.

FIG. 12 illustrates typical discharge curves for a lithium ion cell being discharged at different current loads. Discharge of the cell should occur just before the voltage drops off precipitously. Although an absolute voltage cutoff may be employed (e.g., 2.5 volts), cutoff would occur prematurely at higher loads. For example, the curve labeled 2600 represents current discharge at 20 amps. In this instance, current would be discharged for a very brief time before an absolute voltage cutoff of 2.5 volts was reached. Strategies for compensating the voltage cutoff values for current draw are known. These strategies include measuring current and altering the voltage cutoff threshold based on the measured current. Techniques for measuring current require additional current measurement and conditioning circuits. Therefore, it would be desirable to implement voltage cutoff schemes without having to directly measure current.

One technique for measuring current is to use the battery itself as a shunt. In this technique, current is interrupted periodically (e.g., once every second). Battery voltage is measured while current is discharged from the battery and while the current draw interrupted. In an exemplary embodiment, the impedance of a battery cell is known to be on the order of 48 milliohms per cell. In this case, the current can be calculated as follows:

Current=(battery voltage with current off−battery voltage with current on)/48 milliohms Since the cell impedance can change over time, the battery impedance can be stored in a memory and updated periodically. For example, the battery impedance can be determined while the battery is being charged. While the charger outputs a known current to the battery, the battery voltage can be measured with the current on and with the current off. This voltage variance can then be used to determine and adjust the stored battery impedance value. Other techniques for determining and/or updating the battery impedance are contemplated by this disclosure.

Figure 13:
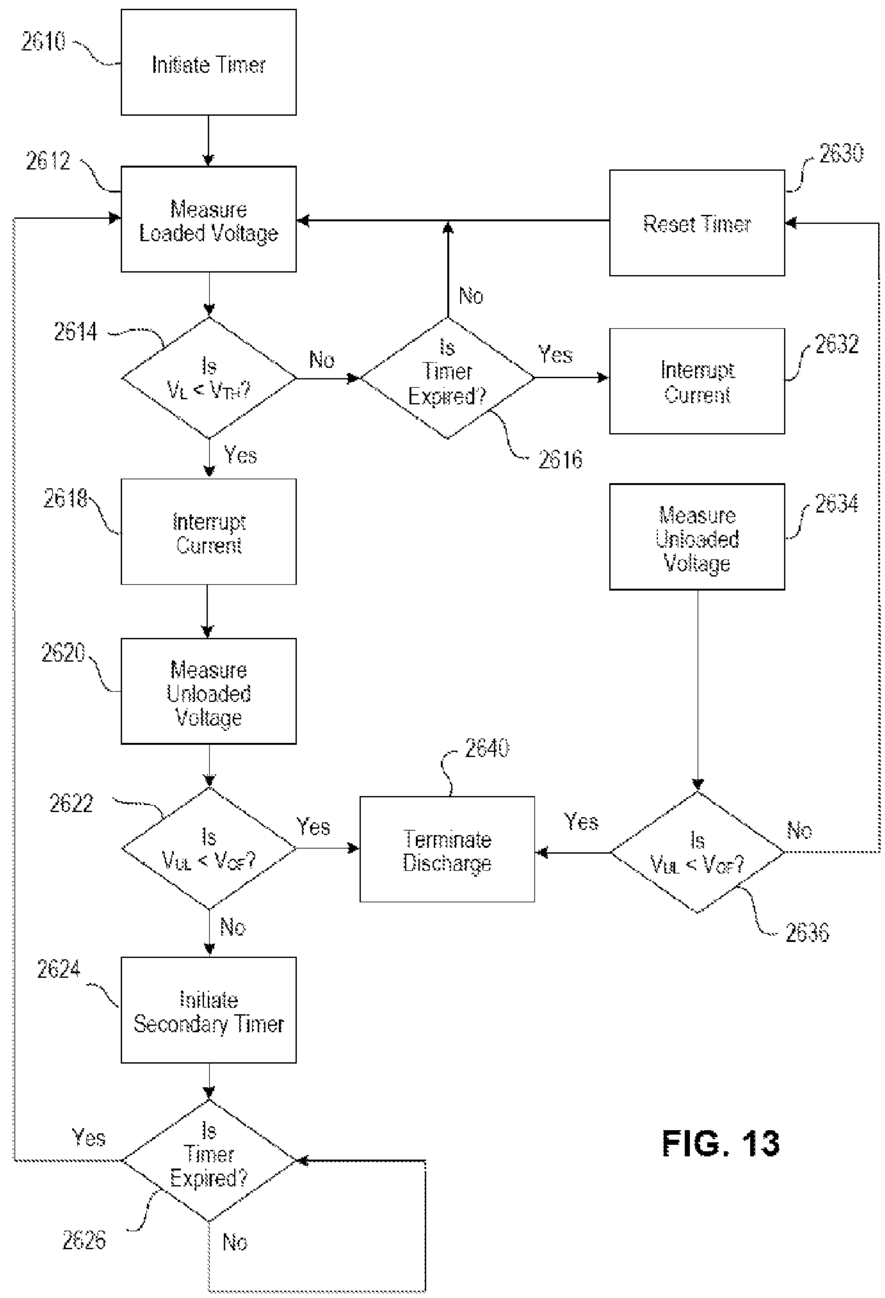
FIG. 13 is a flowchart illustrating an exemplary embodiment of a voltage cutoff scheme for use in a power tool application.

An alternative voltage cutoff scheme is further described with reference to FIG. 13. During discharge of the battery, the current being drawn from the battery is periodically interrupted for a short period of time. This short period of time should be such that the user does not feel or otherwise detects the interrupt (e.g., 3-5 milliseconds). During this interrupt period, a voltage measure is taken of the battery. The voltage measure may be of a single cell, a portion of the cells or the entire stack. The voltage measure is then compared to a target cutoff voltage. The battery is not considered sufficiently discharged if the voltage measure is above the target cutoff voltage or rises above the target cutoff voltage during the interrupt period. In this case, the interrupt period ends and current draw from the battery resumes. On the other hand, if the voltage measure is below the target cutoff, then discharging of the battery is terminated. In this way, the resting voltage of the battery is measured directly and current compensation can be avoided.

In this exemplary embodiment, the voltage measure is taken periodically or when a measurement of the loaded voltage (i.e., when current is being drawn from the battery) drops below a loaded voltage threshold (e.g., 2.7 volts for a lithium ion cell). When the battery begins discharging, an interrupt timer is started at 2610 to achieve a periodic sampling (e.g., once per second). Other techniques for achieving a periodic sampling rate are also contemplated by this disclosure.

Next, a voltage measure is taken 2612 of the battery while the battery is being discharged. The voltage measure may be of a single cell, a portion of the cells or the entire stack. In any case, the voltage measure is compared at 2614 to a loaded voltage threshold. Expiration of the interrupt timer is checked at 2616 if the voltage measure exceeds the loaded voltage threshold. This cycle is repeated so long as the voltage measure exceeds the loaded voltage threshold and the timer has yet to expire.

Once the timer expires, the current draw from the battery is interrupted at 2632 and a second voltage measure is taken at 2634 during the interrupt period. In the exemplary embodiment, there is an inherent delay from when the current is interrupted until the time at which the second voltage measure is made by the microcontroller; this delay (preferably one the order of 2 ms) enables the voltage is return to its resting value. In other embodiments, it may be necessary for the control module to enforce a delay before taking the second voltage measure. In any case, the second voltage measure is in turn compared to a target cutoff voltage at 2636. The target cutoff voltage preferably is an unloaded voltage threshold (e.g., 2.7 volts for a lithium ion cell) although is may be the same as the loaded voltage threshold. If the second voltage measure is not below the target cutoff voltage, then the current interrupt ends and discharging of the battery may resume. In this case, the interrupt timer is reset at 2630. If the second voltage measure is below the target cutoff, then discharging of the battery is terminated as indicated at 2640.

Likewise, if the voltage measure exceeds the loaded voltage threshold, then the current draw from the battery is interrupted at 2618 and a second voltage measure is taken 2620 during the interrupt period. The second voltage measure is again compared at 2622 to the target cutoff voltage. If the second voltage measure is below the target cutoff, then discharging of the battery is terminated as indicated at 2640.

On the other hand, if the second voltage measure is not below the target cutoff, then the current interrupt ends and discharging of the battery may resume. To avoid excessive voltage measurements while the loaded voltage is below its threshold, a secondary timer (also referred to herein as a blank timer) is initiated at 2626. The battery voltage will not be measured again until this secondary timer expires. Once the secondary timer expires, control returns to step 2612 and the process is repeated.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A method for operating a power tool having a trigger switch and a motor powered by a battery pack, comprising:

setting the duty cycle of a pulse width modulated control signal in accordance with a position of the trigger switch;

delivering power from the battery pack to the motor in accordance with the control signal;

monitoring a parameter indicative of tool operation while power is delivered from the battery pack to the motor using a controller residing in the power tool;

detecting a condition of the parameter indicating a shutdown of the power is imminent; and fading the power delivered from the battery to the motor, in response to the detected condition, using the controller, wherein the fading step comprises:

computing a value of the duty cycle as a function of a value of the parameter, and setting the duty cycle of the control signal to the computed value of the duty cycle when the computed value of the duty cycle is less than the duty cycle set in accordance with position of the trigger switch, and retaining the duty cycle set in accordance with the position of the trigger switch when the computed value of the duty cycle is more than the duty cycle set in accordance with the position of the trigger switch.

2. The method of claim 1 wherein fading of the power delivered is by an amount that is computed as a function of a value of the parameter.

3. The method of claim 1 wherein fading of the power delivered further comprises decreasing the power delivered as a function of the value of the parameter, where the function is at least one of linear, step, exponential or polynomial.

4. The method of claim 1 wherein the parameter is voltage of the battery, comprising: initiating fading of the power delivered when the battery voltage falls below a voltage fade threshold and decreasing the power delivered linearly as a function of the battery voltage until the battery voltage falls below a voltage cutoff threshold.

5. The method of claim 1 wherein the parameter is temperature in the power tool, the method comprising: initiating fading of the power delivered when the temperature exceeds a temperature fade threshold and decreasing the power delivered linearly as a function of the temperature until the temperature exceeds a temperature cutoff threshold.

6. The method of claim 1 wherein the parameter is temperature in the battery pack, the method comprising: fading of the power delivered when the temperature exceeds a temperature fade threshold and decreasing the power delivered linearly as a function of the temperature until the temperature exceeds a temperature cutoff threshold.

7. The method of claim 6, wherein the battery pack includes a positive terminal, a negative terminal, a temperature sense terminal, battery cells coupled to the positive and negative terminals, and a temperature sensor electrically coupled to the positive terminal.

8. A power tool system comprising:

a tool assembly having a motor;

a battery pack that selectively couples to the tool assembly and operates to provide power to the motor;

a trigger switch disposed on the tool assembly;

a discharge control module that is in data communication with the trigger switch and regulates power provided to the motor in accordance with a position of the trigger switch by adjusting a duty cycle of pulse width modulated control signal of a switch disposed in series with the motor, wherein the discharge control module is configured to monitor a parameter indicative of tool operation while power is delivered from the battery pack to the motor and fade the power delivered from the battery to the motor by adjusting the duty cycle of the control signal by an amount that is computed as a function of a value of the parameter, wherein the discharge control module sets the duty cycle to a value computed as a function of a value of the parameter when the computed value of the duty cycle is less than the duty cycle set in accordance with position of the trigger switch, and retains the duty cycle set in accordance with the position of the trigger switch when the computed value of the duty cycle is more than the duty cycle set in accordance with the position of the trigger switch.

9. The power tool system of claim 8 wherein the discharge control module fades the power delivered by decreasing the power delivered as a function of the value of the parameter, where the function is at least one of linear, step, exponential or polynomial.

10. The power tool system of claim 8, wherein the discharge control module monitors voltage of the battery, initiates fading of the power delivered when the battery voltage falls below a voltage fade threshold and decreases the power delivered linearly as a function of the battery voltage until the battery voltage falls below a voltage cutoff threshold.

11. The power tool system of claim 8, further comprising a temperature sensor disposed in the tool assembly, wherein the discharge control module is configured to receive a temperature measure from the temperature sensor, initiate fading of the power delivered when the temperature exceeds a temperature fade threshold and decrease the power delivered linearly as a function of the temperature until the temperature exceeds a temperature cutoff threshold.

12. The power tool system of claim 8, further comprising a temperature sensor disposed in the battery pack and in data communication with the discharge control module, wherein the discharge control module is configured to monitor temperature in the battery pack, initiate fading of the power delivered when the temperature exceeds a temperature fade threshold and decrease the power delivered linearly as a function of the temperature until the temperature exceeds a temperature cutoff threshold.

13. The power tool of claim 12, wherein the battery pack includes a positive terminal, a negative terminal, a temperature sense terminal, battery cells coupled to the positive and negative terminals, and a temperature sensor electrically coupled to the positive terminal.

14. The power tool of claim 8, wherein the switch is disposed in series with battery cells of the battery pack.

15. The power tool system of claim 8, wherein the discharge control module resides in the tool assembly.

16. The power tool system of claim 8, wherein the discharge control module resides in the battery pack.

17. A power tool system comprising:

a tool assembly having a motor;

a battery pack having a plurality of battery cells that selectively couples to the tool assembly via a positive terminal and a negative terminal to provide electric power to the motor;

a trigger switch disposed on the tool assembly; and a discharge control module within the tool assembly that controls power delivered from the battery to the motor in accordance with a position of the trigger switch, wherein the discharge control module is electrically coupled to the battery pack to measure voltage of the battery cells while the tool is being operated by a user by interrupting current flow from the battery pack to the motor momentarily via a power switch while the trigger switch is being pulled by the user and measuring voltage of the battery in an unloaded condition while current flow is interrupted, the discharge control module being further configured to compare the unloaded voltage measure to a voltage cutoff threshold, and resume current flow from the battery to the motor when the unloaded voltage measure exceeds the voltage cutoff threshold.

18. The power tool of claim 17, wherein the discharge control module is configured to terminate current discharge of the battery via the switch when the unloaded voltage measure is less than the voltage cutoff threshold.

19. The power tool of claim 17, wherein the discharge control module is configured to interrupt current via the power switch for a period of time on the order of milliseconds to measure voltage of the battery in an unloaded condition.

20. The power tool of claim 17, wherein the discharge control module is configured to delay the voltage measure of the battery in an unloaded condition.

21. The power tool of claim 17, wherein the discharge control module is configured to measure voltage of a single battery cell or a portion of the battery cells.

22. The power tool of claim 17, wherein the discharge control module is configured to interrupt current periodically via the switch to measure voltage of the battery in an unloaded condition while current is being drawn from the battery.

23. The power tool of claim 17, wherein the discharge control module is configured to fade the power delivered from the battery to the motor by an amount that is computed as a function of a value of the unloaded voltage measure.

* * * * *